US008859188B2

(12) United States Patent
Jansen et al.

(10) Patent No.: US 8,859,188 B2
(45) Date of Patent: Oct. 14, 2014

(54) IMMERSION LIQUID, EXPOSURE APPARATUS, AND EXPOSURE PROCESS

(75) Inventors: Hans Jansen, Eindhoven (NL); Marco Koert Stavenga, Eindhoven (NL); Jacobus Johannus Leonardus Hendricus Verspay, Thorn (NL); Franciscus Johannes Joseph Janssen, Eindhoven (NL); Anthonie Kuijper, Bruegel (NL)

(73) Assignee: ASML Netherlands B.V., Veldhoven (NL)

( * ) Notice: Subject to any disclaimer, the term of this patent is extended or adjusted under 35 U.S.C. 154(b) by 1673 days.

(21) Appl. No.: 11/883,944

(22) PCT Filed: Feb. 6, 2006

(86) PCT No.: PCT/EP2006/001005
§ 371 (c)(1),
(2), (4) Date: Jun. 17, 2008

(87) PCT Pub. No.: WO2006/084641
PCT Pub. Date: Aug. 17, 2006

(65) Prior Publication Data
US 2009/0134488 A1    May 28, 2009

Related U.S. Application Data

(63) Continuation of application No. 11/071,044, filed on Mar. 3, 2005, now abandoned.

(60) Provisional application No. 60/651,513, filed on Feb. 10, 2005.

(51) Int. Cl.
*H01L 21/67* (2006.01)

(52) U.S. Cl.
CPC .................................. *G06F 7/70341* (2013.01)
USPC ........................................... 430/319; 355/30

(58) Field of Classification Search
CPC .. G03F 7/70341; G03F 7/2041; G03F 7/2043
USPC ........................................... 430/319; 355/30
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,405,701 A | 9/1983 | Banks et al. | 430/5 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,560,032 B2 | 5/2003 | Hatano | 359/656 |
| 6,600,547 B2 | 7/2003 | Watson et al. | 355/30 |
| 6,603,130 B1 | 8/2003 | Bisschops et al. | 250/492.1 |
| 7,029,832 B2 | 4/2006 | Rolland et al. | |
| 7,116,394 B2 | 10/2006 | Bakker et al. | |
| 7,292,309 B2 | 11/2007 | Honda | |
| 7,317,504 B2 | 1/2008 | De Smit et al. | |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0218157 A1 | 11/2004 | Bakker et al. | |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |

(Continued)

FOREIGN PATENT DOCUMENTS

CN      1323445    11/2001
CN      1534381    10/2004

(Continued)

OTHER PUBLICATIONS

Ammonia—The Rest of the Story, Alfred E. Whitehouse, J. Randolph Straughan, Apr. 1986, Proceedings Seventh Annual West Virginia Surface Mine Drainage Task Force Symposium.*

(Continued)

*Primary Examiner* — Daborah Chacko Davis
(74) *Attorney, Agent, or Firm* — Pillsbury Winthrop Shaw Pittman LLP

(57) ABSTRACT

An immersion liquid is provided comprising an ion-forming component, e.g. an acid or a base, that has a relatively high vapor pressure. Also provided are lithography processes and lithography systems using the immersion liquid.

32 Claims, 2 Drawing Sheets

(56) References Cited

U.S. PATENT DOCUMENTS

| | | | |
|---|---|---|---|
| 2005/0007570 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0041225 A1* | 2/2005 | Sengers et al. | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/30 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0161644 A1 | 7/2005 | Zhang et al. | |
| 2005/0173682 A1 | 8/2005 | Zhang et al. | |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2005/0270505 A1* | 12/2005 | Smith | 355/53 |
| 2006/0050257 A1 | 3/2006 | Honda | 355/67 |
| 2007/0229795 A1 | 10/2007 | Zhang et al. | |
| 2010/0171940 A1 | 7/2010 | Nagahashi | |

FOREIGN PATENT DOCUMENTS

| | | |
|---|---|---|
| CN | 1573567 | 2/2005 |
| CN | 1577100 | 2/2005 |
| CN | 1577106 | 2/2005 |
| DE | 206 607 | 2/1984 |
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 0 834 773 | 4/1998 |
| EP | 1039511 | 9/2000 |
| EP | 1 329 773 | 7/2003 |
| EP | 1 482 372 | 12/2004 |
| EP | 1 486 827 A2 | 12/2004 |
| EP | 1557721 A2 | 7/2005 |
| EP | 1 670 040 | 6/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-060082 | 3/1995 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2000-159504 | 6/2000 |
| JP | 2001-091849 | 4/2001 |
| JP | 2004-193252 | 7/2004 |
| JP | 2004-282023 | 10/2004 |
| JP | 2004-289126 | 10/2004 |
| JP | 2004335821 | 11/2004 |
| JP | 2004-343114 | 12/2004 |
| JP | 2004-363588 | 12/2004 |
| JP | 2005-005713 | 1/2005 |
| JP | 2005-045265 | 2/2005 |
| JP | 2005-079140 | 3/2005 |
| JP | 2005-136374 | 5/2005 |
| JP | 2005-183693 | 7/2005 |
| JP | 2005-252239 | 9/2005 |
| JP | 2006-520104 T | 8/2006 |
| JP | 2007-520893 | 7/2007 |
| JP | 4438748 | 3/2010 |
| KR | 10-2004-0098563 | 11/2004 |
| TW | 200422783 | 11/2004 |
| TW | 200428132 | 12/2004 |
| TW | 2005-32388 A | 10/2005 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/081666 | 9/2004 |
| WO | WO 2004/090577 | 10/2004 |
| WO | WO 2004/090633 | 10/2004 |
| WO | WO 2004/090634 | 10/2004 |
| WO | WO 2004/090956 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/001432 | 1/2005 |
| WO | WO 2005/010611 | 2/2005 |
| WO | WO 2005/024517 | 3/2005 |
| WO | 2005031824 | 4/2005 |
| WO | WO 2005/062351 | 7/2005 |

OTHER PUBLICATIONS

M. Switkes et al., "Immerson Lithography at 157 nm", MIT Lincoln Lab, Orlando Jan. 2001, Dec. 17, 2001.

M. Switkes et al., "Immerson Lithography at 157 nm", J. Vac. Sci. Technol. B. vol. 19, No. 6, Nov./Dec. 2001, pp. 2353-2356.

M. Switkes et al. "Immerson Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

(56) References Cited

OTHER PUBLICATIONS

G. Owen et al., "1/8μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tools", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).
PCT Search Report issued for PCT Application No. PCT/EP2006/001005, dated Aug. 17, 2006.
K. Varga et al., "Streaming Potential Cells for the Study of Erosion-Corrosion Caused by Liquid Flow," J. Phys. D. Appl. Phys., vol. 18 (1985) pp. 211-220.
Chinese Office Action for Chinese Application No. 200680004444.6 dated May 8, 2009.
Office action in related Taiwanese application No. 095104379 issued Mar. 26, 2010.
Office action in related European application No. 06 706 660.5-2222 dated Jun. 2, 2010.
Japanese Office Action mailed Oct. 15, 2010 in related Japanese patent application No. 2007-554487.
Korean Office Action dated Jan. 25, 2011 in corresponding Korean Patent Application No. 10-2009-7016738.
Japanese Office Action mailed May 16, 2011 in corresponding Japanese Patent Application No. 2007-554487.
Japanese Office Action dated May 16, 2011 in corresponding Japanese Patent Application No. 2007-554487.
Japanese Office Action mailed Jun. 21, 2012 in corresponding Japanese Patent Application No. 2011-089751.
Japanese Office Action mailed Jun. 21, 2012 in corresponding Japanese Patent Application No. 2011-250615.
Japanese Office Action mailed Mar. 15, 2012 in corresponding Japanese Patent Application No. 2007-554487.
Taiwan Office Action dated Jun. 21, 2013 in corresponding Taiwan Patent Application No. 099105739.
Chinese Office Action dated Jun. 19, 2013 in corresponding Chinese Patent Application No. 201110325529.7.
Chinese Office Action dated Feb. 22, 2013 in corresponding Chinese Patent Application No. 201110254562.5.
European Office Action dated Jun. 28, 2012 in corresponding European Patent Application No. 06 706 660.5-2222.
Chinese Office Action dated May 30, 2013 in corresponding Chinese Patent Application No. 201110325152.5.

\* cited by examiner

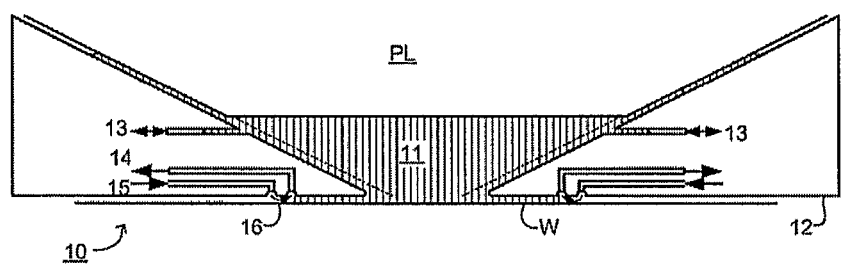

IMMERSION LIQUID, EXPOSURE APPARATUS, AND EXPOSURE PROCESS

CROSS REFERENCE TO RELATED APPLICATIONS

This application is the U.S. National Phase of PCT/EP2006/001005, filed Feb. 6, 2006, which in turn claims benefit and priority as a continuation to U.S. application Ser. No. 11/071,044, filed on 3 Mar. 2005, which claims the benefit of U.S. provisional application 60/651,513, filed on 10 Feb. 2005. Both priority applications are hereby incorporated in their entirety by reference.

FIELD

The invention relates to immersion liquids, exposure apparatus, and exposure processes.

BACKGROUND

Immersion lithography is gaining attention due to improvements in critical dimensions and/or depth of focus that it provides. However, the technology also faces some concerns. For instance, on the one hand an ultra-pure immersion liquid may be advantageous to minimize the appearance of stains when drying areas wetted by the liquid, but on the other hand it may be desirable to include additives in the immersion liquid to influence or create desirable properties. E.g., it may be desirable to include acid components in the immersion liquid to avoid or minimize so-called T-topping or other undesirable effects. T-topping, for instance, may occur when a resist layer on a substrate to be exposed to radiation comes into contact with the immersion liquid and components in the resist (e.g. photo-acid generators) diffuse or dissolve into the immersion liquid. See also EP 1 482 372 A1.

Accordingly, objectives of the invention include providing an immersion liquid comprising one or more additives yet having reduced staining concerns.

Also, objectives of the invention include avoiding or minimizing streaming potential effects caused by the flow of immersion liquid (discussed in more detail infra).

SUMMARY

The invention provides immersion liquids, exposure apparatus, and exposure processes.

In an embodiment, the invention provides an immersion liquid formed by a method comprising adding an ion-forming component to a liquid (e.g. an aqueous liquid), wherein said ion-forming component has a vapor pressure greater than O.1 kPa, e.g. greater than water.

In an embodiment, the invention provides an immersion liquid having a pH below 7, said pH below 7 being at least partly caused by a component having a vapor pressure greater than 0.1 kPa, e.g. greater than water.

In an embodiment, the invention provides an immersion liquid having a pH greater than 7, said pH greater than 7 being at least partly caused by a component having a vapor pressure greater than 0.1 kPa, e.g. greater than water.

In an embodiment, the invention provides an immersion liquid having an electric conductivity of at least 0.1 µS/cm, e.g. at least 1.3 µS/cm at 25° C. hn an embodiment, the invention provides an immersion liquid having an electric conductivity in the range of 0.1-100 µS/cm at 25° C., e.g. in the range of 1.3-100 µS/cm at 25° C. In an embodiment, the conductivity is at least partly caused by a component having a vapor pressure greater than 0.1 kPa, e.g. greater than water.

Also, the invention provides processes, e.g. an immersion lithography process, using the immersion liquids. In an embodiment, the invention provides a device manufacturing process comprising exposing a photosensitive substrate to radiation, wherein said radiation has passed through the immersion liquid prior to reaching said substrate.

In addition, the invention provides immersion lithography systems comprising an immersion lithography apparatus and one or more of the immersion liquids.

In an embodiment, the invention provides a process comprising:
(i) adding a component to a liquid, said component having a vapor pressure greater than 0.1 IcPa, e.g. greater than water;
(ii) exposing a photosensitive substrate to radiation, wherein said radiation has passed through said aqueous liquid comprising said component prior to reaching said photosensitive substrate;
wherein said adding of said component increases the ion concentration in said liquid.

In an embodiment, the invention provides a process comprising:
(i) adding an acid to a liquid, said acid having a vapor pressure of at least 0.IkPa, e.g. at least 5 kPa;
(ii) exposing a photosensitive substrate to radiation, wherein said radiation has passed through said liquid comprising said component prior to reaching said photosensitive substrate.

In an embodiment, the invention provides a process comprising:
(i) patterning a beam of radiation;
(ii) passing the patterned beam of radiation through a liquid (e.g. an aqueous liquid), said liquid comprising ions formed by a component having a vapor pressure greater than 0.1 kPa, the conductivity of said liquid being at least 0.25 µS/cm;
(iii) exposing a photosensitive substrate to the patterned beam of radiation.

In an embodiment, the invention provides an immersion lithography system comprising:
(i) an immersion lithography exposure apparatus; and
(ii) an immersion liquid, e.g. an immersion having an electric conductivity in the range of 0.1-100 µS/cm at 25° C. (for instance in the range of 1.3-100 µS/cm at 25° C.) or a carbon dioxide enriched immersion liquid.

In an embodiment, the invention provides a lithography apparatus having a voltage generator capable of applying a voltage difference between a first part of a lithography apparatus, e.g. a substrate table, and a second part of the lithography apparatus, e.g. an immersion hood of an immersion lithography apparatus. In an embodiment, the invention provides a process comprising applying a voltage difference between a first part of a lithography apparatus, e.g. the substrate table, and a second part of the lithography apparatus, e.g. the immersion hood of an immersion lithography apparatus.

Additional objects, advantages and features of the invention are set forth in this specification, and in part will become apparent to those skilled in the art on examination of the following, or may be learned by practice of the invention.

BRIEF DESCRIPTION OF THE DRAWINGS

FIG. 2 represents an embodiment of an immersion hood of an immersion lithography system according to an embodiment of the invention.

DETAILED DESCRIPTION

Figure 1:
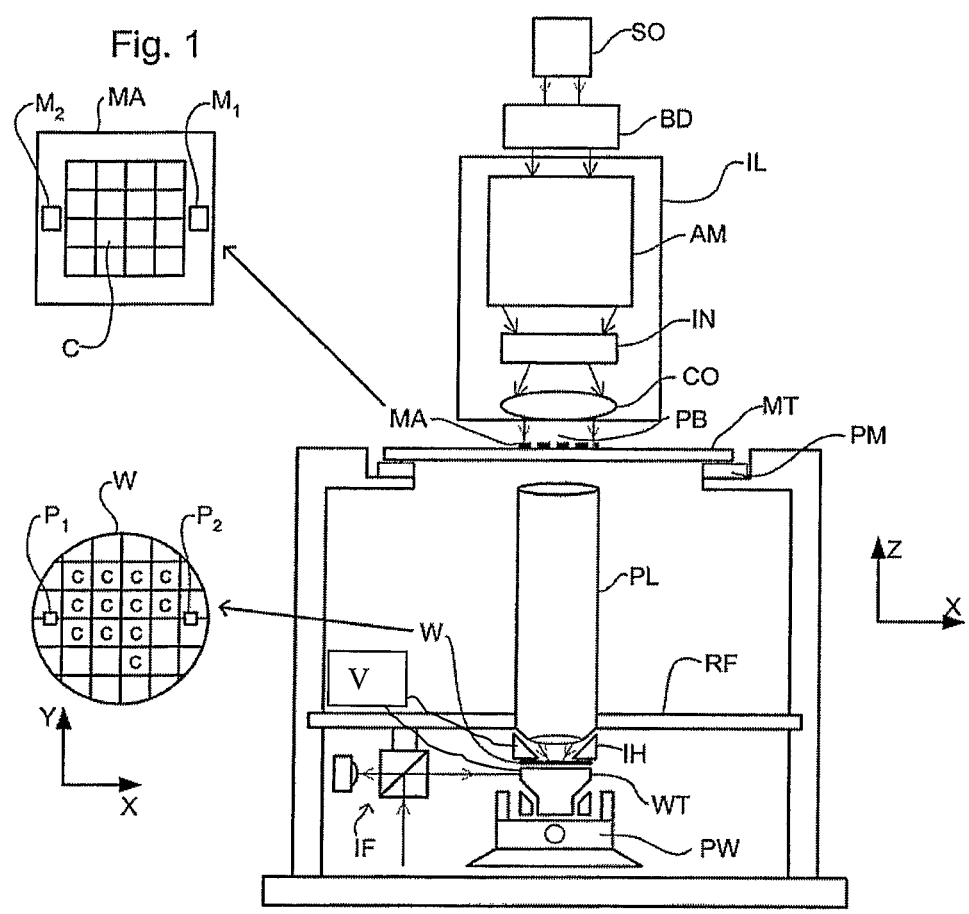
FIG. 1 represents an immersion lithography system according to an embodiment of the invention.

Preliminarily, this application at various instances refers to vapor pressures of components, ha this regard, the vapor pressure of a component refers to the vapor pressure of a component in its pure form (thus not in a mixture or in solution) at 20° C.

In an embodiment, the invention provides an immersion liquid. Also, the invention provides a process using an immersion liquid, e.g. an immersion lithography process.

Immersion Liquid

In an embodiment, the immersion liquid is prepared by a process comprising adding one or more components to a liquid, e.g. an aqueous liquid, for instance a liquid comprising, relative to the total weight of the liquid, at least 50 wt % water, such as at least 75 wt % water, at least 90 wt % water, at least 95 wt % water, at least 99 wt % water, at least 99.5 wt % water, at least 99.9 wt % water, or at least 99.99 wt % water. In an embodiment, the liquid, before adding the one or more components, has an electric conductivity of less than 0.1 µS/cm (as determined at 25° C.). In an embodiment, the liquid is de-gassed before adding the one or more components. In an embodiment, the liquid is purified before adding the one or more components. In an embodiment, the liquid is ultra-pure, de-gassed water.

In an embodiment, the component added to the liquid has a relatively high vapor pressure. A high vapor pressure may assist, e.g., in avoiding stains on a substrate when immersion liquid is removed (e.g., evaporated) from the substrate. In an embodiment, the component added to the liquid has a vapor pressure exceeding the vapor pressure of the liquid it is added to. In an embodiment, the component added to the liquid has a vapor pressure of at least 0.1 kPa, e.g. at least 0.25 kPa, at least 0.5 kPa, at least 0.75 kPa, at least 1 kPa, at least 1.3 kPa, at least 1.5 kPa, at least 1.8 kPa, at least 2.1 kPa, or exceeding the vapor pressure of water (i.e., exceeding 2.34 kPa). In an embodiment, the component added to the liquid has a vapor pressure of at least 3.5 kPa, such as at least 5 kPa, at least 1OkPa, at least 2OkPa, at least 3OkPa, or at least 5OkPa. In an embodiment, the component being added is formic acid or acetic acid. In an embodiment, the component added to the liquid is, in its pure form at 20° C. and at 1 atmosphere pressure, a gas. In an embodiment, the component added to the liquid is carbon dioxide. In an embodiment, the immersion liquid comprises, relative to the total weight of the immersion liquid, less than 5 wt % of components having a vapor pressure below 2.OkPa (e.g. below 1.5 kPa, below 1 kPa, below 0.5 kPa, below 0.25IcPa, below 0.1 kPa, or OkPa), e.g. less than 3 wt %, less than 1 wt %, less than 0.5 wt %, less than 0.25 wt %, less than 0.1 wt %, less than 0.05 wt %, less than 0.025 wt %, less than 0.01 wt %, or less than 0.005 wt %. In an embodiment, the immersion liquid comprising the component having a relatively high vapor pressure is, not taking into account the main constituent of the immersion liquid (e.g., water in an immersion liquid having water as the main constituent), essentially absent components having a vapor pressure below 2.OkPa, e.g. below 1.5 kPa, below 1 kPa, below 0.5 kPa, below 0.25 kPa, below 0.1 kPa, or OkPa.

In an embodiment, the component added to the liquid promotes conductivity of the liquid, e.g. by promoting ion formation. Increased conductivity of the immersion liquid may assist in decreasing or avoiding streaming potential concerns. Streaming potential is discussed in, e.g., the article "Streaming Potential Cells For The Study of Erosion-Corrosion Caused By Liquid Flow" by Varga and Dunne in J. Phys. D: Appl. Phys., 18 (1985), p. 21 1-220. Streaming potential may, e.g., shorten the lifetime, for instance through corrosion or erosion, of e.g. coatings, sensors and/or (alignment) markers that come into contact with the flow of immersion liquid (in particular substantially conductive components of, e.g., coatings, sensors, and/or markers). In an embodiment, the conductivity of the liquid comprising the component is at least 0.1 µS/cm at 25° C., for instance at least 0.25 µS/cm, at least 0.5 µS/cm, at least 0.75 µS/cm, at least 1 µS/cm, at least 1.3 µS/cm, at least 1.5 µS/cm, at least 1.75 µS/cm, at least 2 µS/cm, at least 3 µS/cm, at least 5 µS/cm, at least 10 µS/cm, at least 25 µS/cm, or at least 50 µS/cm. While the above-mentioned and below-mentioned conductivities are determined at 25° C., the temperature at which the immersion liquid is used may be different. The values referred to, however, remain the conductivities as determined at 25° C.

While increased conductivity may assist in reducing or eliminating the effect of streaming potential, it may also increase the amount of component(s) that needs to be added to the immersion liquid, which may lead to staining or bubble concerns. In an embodiment, the conductivity of the liquid comprising the component is less than 50 mS/cm at 25° C., e.g. less than 25 mS/cm, less than 10 mS/cm, less than 5 mS/cm, less than 1 mS/cm, less than 500 µS/cm, less than 250 µS/cm, less than 150 µS/cm, less than 75 µS/cm, less than 50 µS/cm, less than 25 µS/cm, less than 15 µS/cm, less than 10 µS/cm, less than 7 µS/cm, less than 4 µS/cm, or less than 2 µS/cm. In an embodiment, the conductivity of the liquid is in the range of 0.1-100 µS/cm at 25° C., e.g. 0.25-25 µS/cm, 0.4-10 µS/cm, or 0.6-6 µS/cm. In one embodiment, the conductivity of the liquid, e.g. an aqueous liquid, for instance ultra-pure water, is increased by adding salts or acids to the liquid. In an embodiment, the liquid is enriched with acetic acid, formic acid, $CO_2$ ($CO_2$ may form in/with water the ions $H^+$ and $HCO_3^-$), or $NH_3$ ($NH_3$ may form in/with water the ions $NH_4^+$ and $OH^-$).

Also, streaming potential may be reduced or avoided by decreasing the speed and/or turbulence of the water flow. Furthermore, while not necessarily avoiding streaming potential itself, providing a voltage difference between the area effected by the streaming potential (e.g. the substrate table, for instance a sensor or a sensor plate on the substrate table) and another area may limit or negate the undesirable effects caused by the streaming potential. In an embodiment, the invention provides a lithography apparatus having a voltage generator capable of applying a voltage difference between a first part of a lithography apparatus, e.g. the substrate table, and a second part of the lithography apparatus, e.g. the immersion hood of an immersion lithography apparatus. In an embodiment, the invention provides a process comprising applying a voltage difference between a first part of a lithography apparatus, e.g. the substrate table, and a second part of the lithography apparatus, e.g. the immersion hood of an immersion lithography apparatus. In an embodiment, the voltage difference is at least 0.1V, for instance at least 0.25V, at least 0.5V, at least IV, at least 2V, at least 3V, at least 4V, or at least 5V. In an embodiment, the voltage difference is less than 50V.

In an embodiment, the component added to the liquid is an acidic component, e.g. acetic acid, formic acid, or carbon dioxide. Acidity of the immersion liquid may assist in maintaining the effectiveness of resist that may come into contact with the immersion liquid, e.g. by helping to slow down/ decrease diffusion or dissolution of photo-acid generators, that may be present in the resist, into the immersion liquid. In an embodiment, the liquid comprising the component has a pH below 7, e.g. below 6.5, below 6.0, below 5.5, below 5.0, below 4.5, or below 4.0. In an embodiment, the pH is at least 2.0, such as at least 2.5, at least 3.0, at least 3.5, at least 3.75, at least 4.0, at least 4.5, at least 5.0, or at least 5.5. In an embodiment, the component added to the liquid is a base, e.g. ammonia ($NH_3$). Alkalinity of the immersion liquid may assist in maintaining the effectiveness of resist that may come into contact with the immersion liquid should the resist comprise alkaline components (bases) rather than acid components that may leak into the immersion liquid. In an embodiment, the liquid comprising the component has a pH above 7, e.g. above 7.5, above 8, above 8.5, above 9, above 9.5, or above 10. In an embodiment, the pH is below 14.

The manner of adding the (one or more) component(s) to the liquid may vary and may depend to an extent, e.g., on the type of component being added (e.g., whether it is available as a gas, a solid, or a liquid). In an embodiment, the component is added via diffusion through a membrane. For instance, the liquid may flow on one side of a membrane and the component on the other side of the membrane, whereby the membrane is impermeable to the liquid but permeable to the component, thus allowing the component to diffuse into liquid. In an embodiment, the component thus added is a gas, e.g. $CO_2$. In an embodiment, the component is added along with one or more inert gases, e.g. $N_2$. Accordingly, in an embodiment, a liquid (e.g. an aqueous liquid, for instance ultra-pure water) flows on one side of the membrane and a $CO_2/N_2$ mixture flows on the other side of the membrane, allowing $CO_2$ and $N_2$ to diffuse into the liquid. Commercial examples of suitable membrane equipment include, e.g., LIQUI-CEL membrane contactors from MEMBRANA. In an embodiment, the component is added to the liquid by flowing (e.g., dripping) the component into the liquid (or by flowing a comparatively concentrated component/liquid solution into the liquid; e.g., when the component is ammonia and the liquid is water, the ammonia may be added by flowing a comparatively concentrated aqueous ammonia solution into the water). The adding of the (one or more) component(s) may be done remote from the apparatus (the immersion liquid may be "pre-prepared"), the adding may be done in a separate unit that is linked to the apparatus (e.g., a water purification unit for the apparatus may be adapted for adding the one or more components), or the adding may be integrated into the apparatus.

Process

The invention provides processes using the above-mentioned immersion liquids, for instance processes wherein a substrate is exposed to radiation and wherein the radiation passes through the immersion liquid before reaching the substrate.

In an embodiment, a process is provided comprising exposing a substrate to radiation, wherein said radiation has passed through an immersion liquid as described in the above section. In an embodiment, the process comprises patterning a beam of radiation (e.g. with the aid of a reticle or an array of individually programmable elements), passing the patterned beam through a projection system (e.g. an array of lenses), passing the patterned beam through the immersion liquid, and exposing a portion of the substrate with the patterned beam. In an embodiment, the substrate is a semiconductor substrate, e.g. a semiconductor wafer. In an embodiment, the semiconductor substrate material is selected from the group consisting of Si, SiGe, SiGeC, SiC, Ge, GaAs, InP, and InAs. In an embodiment, the semiconductor substrate is a III/V semiconductor compound. In an embodiment, the semiconductor substrate is a silicon substrate. In an embodiment, the substrate is a glass substrate. In an embodiment, the substrate is a ceramic substrate. In an embodiment, the substrate is an organic substrate, e.g. a plastic substrate. In an embodiment, the substrate is a photosensitive substrate, e.g. by having coated the substrate with a layer of resist.

In an embodiment, a device manufacturing process is provided comprising:

(i) patterning a beam of radiation;
(ii) passing the patterned beam of radiation through an aqueous liquid, said aqueous liquid comprising ions formed by a component having a vapor pressure greater than 0.1 kPa;
(iii) exposing a photosensitive substrate to the patterned beam of radiation.

Also, in an embodiment, a process is provided comprising:

(i) patterning a beam of radiation;
(ii) passing the patterned beam of radiation through a liquid comprising an acid or a base, said acid or base having a vapor pressure exceeding the vapor pressure of said liquid;
(ii) exposing a photosensitive substrate to radiation, wherein said radiation has passed through said aqueous liquid comprising said component prior to reaching said photosensitive substrate.

In an embodiment, the process is a lithography process, such as an immersion lithography process. An example of an apparatus for carrying out an immersion lithography process is shown in FIG. 1. The apparatus depicted in FIG. 1 comprises:

an illumination system (illuminator) IL configured to condition a radiation beam PB (e.g. UV radiation or DUV radiation);

a support structure (e.g. a mask table) MT constructed to support a patterning device MA and connected to a first positioner PM configured to accurately position the patterning device in accordance with certain parameters. The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective. Examples of patterning devices include masks and arrays of individually programmable elements (e.g., programmable mirror arrays or programmable LCD panels). Masks are well known in lithography, and include mask types such as binary, alternating phase-shift, and attenuated phase-shift, as well as various hybrid mask types. An example of a programmable mirror array employs a matrix arrangement of small mirrors, which can be individually tilted so as to reflect an incoming radiation beam in different directions. The tilted mirrors impart a pattern in a radiation beam which is reflected by the mirror matrix.

a substrate table (e.g. a wafer table) WT constructed to hold a substrate (e.g. a resist-coated wafer) W and connected to a second positioner PW configured to accurately position the substrate in accordance with certain parameters. In an embodiment, the wafer table comprises one or more sensors (not shown), e.g. an image sensor (for instance a transmission image sensor), a dose sensor, and/or an aberration sensor. In an embodiment, one or more of the sensors comprise one or more metals, e.g. chromium. In an embodiment, one or more of the sensors are coated, e.g. with titanium nitride.

a projection system (e.g., a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of the immersion liquid or the use of a vacuum. In an embodiment, the projection system includes an array of lenses. In an embodiment, the apparatus comprises an array of projection systems, e.g. to increase throughput.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. In an embodiment, the radiation provided by radiation source SO has a wavelength of at least 50 nm, e.g. at least 100nm, at least 150 nm, at least 175 nm, at least 200 nm, at least 225 nm, at least 275 nm, at least 325 nm, at least 350 nm, or at least 360 nm. In an embodiment, the radiation provided by radiation source SO has a wavelength of at most 450 nm, e.g. at most 425 nm, at most 375 ntn, at most 360 nm, at most 325 nm, at most 275 nm, at most 250 nm, at most 225 nm, at most 200 nni, or at most 175 nm. In an embodiment, the radiation has a wavelength of 365 nm, 355 nm, 248 nm, or 193 nm.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device MA, which is held by the support structure MT, and is patterned by the patterning device. Having traversed the patterning device, the radiation beam PB passes through the projection system PL, which focuses the beam onto a target portion C of the substrate W. An immersion hood IH, which is described further below, supplies immersion liquid to a space between the final element of the projection system PL and the substrate W. In an embodiment, the substrate table WT and immersion hood IH are connected to a voltage generator V (e.g., a battery) that is capable of providing a voltage difference between the substrate table WT and the immersion hood IH (e.g. between a sensor plate of substrate table WT and the immersion hood IH).

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided by the patterning device MA, the alignment marks may be located between the dies.

The depicted apparatus could be used in at least one of the following modes:

1. hi step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 illustrates an embodiment of an immersion hood IH. Immersion Hood 10 forms a contactless seal to the substrate around the image field of the projection system so that immersion liquid 11 is confined to fill a space between the substrate surface and the final element of the projection system. The reservoir is formed by a seal member 12 positioned below and surrounding the final element of the projection system PL. Immersion liquid 11 is brought into the space below the projection system and within the seal member 12. The seal member 12 extends a little above the final element of the projection system and the liquid level rises above the final element so that a buffer of liquid is provided. The seal member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The immersion liquid 11 is confined in the immersion hood 10 by a gas seal 16 between the bottom of the seal member 12 and the surface of the substrate W. The gas seal is formed by gas, e.g. air or synthetic air but, in an embodiment, $N_2$ or an inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid.

Products

Some examples of devices that can be created with the present process and system include, e.g., micro electromechanical systems ("MEMS"), thin film heads, integrated passive components, image sensors, integrated circuits ("ICs")—including, e.g., power ICs, analog ICs, and discrete ICs—, and liquid crystal displays.

Having described specific embodiments of the invention, it will be understood that many modifications thereof will readily appear or may be suggested to those skilled in the art, and it is intended therefore that this invention is limited only by the spirit and scope of the following claims.

What is claimed is:
1. A device manufacturing process comprising:
   (i) adding a component, comprising carbon dioxide, to an aqueous liquid to lower the pH of the liquid, said component, prior to being added to the aqueous liquid, having a vapor pressure greater than 0.1 kPa;
   (ii) exposing a photosensitive substrate to radiation, wherein said radiation has passed through said aqueous liquid comprising said component prior to reaching said photosensitive substrate;
   wherein said adding of said component increases the ion concentration in said liquid.
2. The process of claim 1, wherein said component has a vapor pressure greater than water.
3. The process of claim 1, wherein said component has a vapor pressure of at least 1 kPa.
4. The process of claim 1, wherein said liquid comprises, relative to the total weight of said liquid, at least 90 wt % of water.
5. The process of claim 1, wherein said liquid comprises, relative to the total weight of said liquid, at least 99.9 wt % of water.
6. The process of claim 1, wherein said component is a gas at 20° C. and atmospheric pressure.
7. The process of claim 1, wherein said liquid comprising said component has a pH in the range of 4.5-6.0.
8. The process of claim 1, wherein said liquid comprising said component is essentially absent components having a vapor pressure lower than 2.0 kPa.
9. The process of claim 1, wherein said substrate is a semiconductor wafer coated with a layer of resist.
10. The process of claim 1, wherein said radiation is UV radiation having a wavelength in the range of 175 nm-375 nm.
11. The process of claim 1, further comprising passing said radiation through an array of lenses prior to passing said radiation through said liquid comprising said component.
12. The process of claim 1, further comprising patterning said radiation prior to passing said radiation through said liquid comprising said component.
13. The process of claim 12, wherein said patterning is effected with a mask or an array of individually programmable elements.
14. The process of claim 1, wherein said photosensitive substrate rests on a substrate table during said exposing, said substrate table comprising a sensor, said sensor comprising titanium nitride and/or a metal.
15. The process of claim 1, comprising adding at least 2 components having a vapor pressure of at least 0.1 kPa to said liquid.
16. A device manufactured with the process of claim 1.
17. The device of claim 16, wherein said device is an integrated circuit.
18. A device manufacturing process comprising:
   (i) adding carbon dioxide to a liquid to form an aqueous liquid to (i) reduce or avoid diffusion or dissolution of a component of a photosensitive resist of a substrate into the liquid, or (ii) reduce or avoid streaming potential in the liquid, or both (i) and (ii), said carbon dioxide, prior to being added to the liquid, having a vapor pressure of at least 0.1 kPa;
   (ii) exposing the photosensitive substrate to radiation, wherein said radiation has passed through said liquid comprising said carbon dioxide prior to reaching said photosensitive substrate.
19. The process of claim 18, wherein said component has a vapor pressure of at least 1 kPa.
20. The process of claim 18, wherein said liquid comprising said component is essentially absent components having a vapor pressure lower than 2.0 kPa.
21. A device manufacturing process comprising:
   patterning a beam of radiation;
   (ii) passing the patterned beam of radiation through an aqueous liquid, said aqueous liquid comprising ions formed by carbon dioxide, the conductivity of said aqueous liquid being at least 0.25 μS/cm (as determined at 25° C.); and (iii) exposing a photosensitive substrate to the patterned beam of radiation.

22. The process of claim 21, wherein said conductivity is in the range of 2-10 μS/cm.

23. An immersion lithography system comprising:
(i) an immersion lithography exposure apparatus; and
(ii) an aqueous immersion liquid having carbon dioxide and an electric conductivity in the range of 1.3-100 μS/cm (as determined at 25° C.).

24. The system of claim 23 wherein said conductivity is at least 5 μS/cm.

25. The system of claim 23, wherein said conductivity is at most 50 μS/cm.

26. The system of claim 23, wherein said conductivity is in the range of 2-10 μS/cm.

27. The system of claim 23, wherein said immersion liquid is formed by adding a salt, a base, or an acid to an aqueous liquid.

28. The system of claim 23, wherein said immersion liquid has a pH below 6.0.

29. The system of claim 23, wherein said immersion lithography exposure apparatus includes a substrate table having a sensor comprising chromium and/or titanium nitride.

30. The system of claim 23, wherein said conductivity is caused at least in part by a component having a vapor pressure greater than 5 kPa.

31. An immersion lithography exposure apparatus comprising:
a liquid supply system, having a source of a component comprising carbon dioxide, configured to add the component to an aqueous liquid, the component, prior to being added to the aqueous liquid, having a vapor pressure greater than 0.1 kPa and the adding of the component increasing the ion concentration in the liquid; and
a projection system configured to expose a photosensitive substrate to radiation, wherein the radiation passes through the aqueous liquid comprising the component prior to reaching the photosensitive substrate.

32. The apparatus of claim 31, wherein the component has a vapor pressure of at least 1 kPa.

* * * * *